(12) United States Patent
Mohtashami et al.

(10) Patent No.: US 10,976,345 B2
(45) Date of Patent: Apr. 13, 2021

(54) ATOMIC FORCE MICROSCOPY DEVICE, METHOD AND LITHOGRAPHIC SYSTEM

(71) Applicant: Nederlandse Organisatie voor toegepast-natuurwetenschappelijk onderzoek TNO, s-Gravenhage (NL)

(72) Inventors: Abbas Mohtashami, 's-Gravenhage (NL); Maarten Hubertus van Es, Voorschoten (NL); Hamed Sadeghian Marnani, Nootdorp (NL)

(73) Assignee: NEDERLANDSE ORGANISATIE VOOR TOEGEPAST-NATUURWETEN-SCHAPPELIJK ONDERZOEK TNO, 'S-Gravenhage (NL)

( * ) Notice: Subject to any disclaimer, the term of this patent is extended or adjusted under 35 U.S.C. 154(b) by 21 days.

(21) Appl. No.: 16/477,820

(22) PCT Filed: Jan. 12, 2018

(86) PCT No.: PCT/NL2018/050023
§ 371 (c)(1),
(2) Date: Jul. 12, 2019

(87) PCT Pub. No.: WO2018/132007
PCT Pub. Date: Jul. 19, 2018

(65) Prior Publication Data
US 2019/0369139 A1    Dec. 5, 2019

(30) Foreign Application Priority Data
Jan. 13, 2017   (EP) ..................................... 17151418

(51) Int. Cl.
*G01Q 60/30*   (2010.01)
*G01N 29/06*   (2006.01)
(Continued)

(52) U.S. Cl.
CPC ......... *G01Q 60/30* (2013.01); *G01N 29/0681* (2013.01); *G01Q 10/065* (2013.01); *G01Q 20/02* (2013.01); *G01Q 60/38* (2013.01)

(58) Field of Classification Search
CPC ...... G01Q 60/30; G01Q 10/065; G01Q 20/02; G01Q 60/38; G01Q 70/10; G01Q 60/32; G01N 29/0681; G01N 2291/0427
(Continued)

(56) References Cited

U.S. PATENT DOCUMENTS 6,392,229 B1 *   5/2002   Dana ................... G03F 7/70625
850/33

FOREIGN PATENT DOCUMENTS

CN   101029862 A   9/2007
EP   0721101 A2 *  7/1996 ............. G01N 21/17
(Continued)

OTHER PUBLICATIONS

Andre Striegler et al., "Detection of Buried Reference Structures by Use of Atomic Force Acoustic Microscopy," Ultramiscoscopy, vol. 111, No. 8, pp. 1405-1416, XP 028268522 (May 22, 2011).
(Continued)

*Primary Examiner* — Michael Maskell
(74) *Attorney, Agent, or Firm* — Leydig, Voit & Mayer, Ltd.

(57) ABSTRACT

An atomic force microscopy device arranged for determining sub-surface structures in a sample comprises a scan head with a probe including a flexible carrier and a probe tip arranged on the flexible carrier. Therein an actuator applies an acoustic input signal to the probe and a tip position detector measures a motion of the probe tip relative to the scan head during scanning, and provides an output signal indicative of said motion, to be received and analyzed by a controller. At least an end portion of the probe tip tapers in
(Continued)

a direction away from said flexible carrier towards an end of the probe tip. The end portion has a largest cross-sectional area Amax at a distance Dend from said end, the square root of the largest cross-sectional area Amax is at least 100 nm and the distance Dend is in the range of 0.2 to 2 the value of said square root.

18 Claims, 7 Drawing Sheets

(51) Int. Cl.
  *G01Q 10/06* (2010.01)
  *G01Q 20/02* (2010.01)
  *G01Q 60/38* (2010.01)

(58) Field of Classification Search
  USPC ............................................ 850/21, 33, 36
  See application file for complete search history.

(56) References Cited

FOREIGN PATENT DOCUMENTS

| | | | |
|---|---|---|---|
| EP | 0721101 A2 | 7/1996 | |
| FR | 2697087 A1 * | 4/1994 | ............. G01N 29/06 |
| FR | 2697087 A1 | 4/1994 | |
| WO | WO 2008/141301 A1 | 11/2008 | |
| WO | WO-2008141301 A1 * | 11/2008 | ......... G01N 29/0681 |

OTHER PUBLICATIONS

European Patent Office, International Search Report in corresponding International Application No. PCT/NL2018/050023 dated Apr. 12, 2018 (3 pages).

* cited by examiner

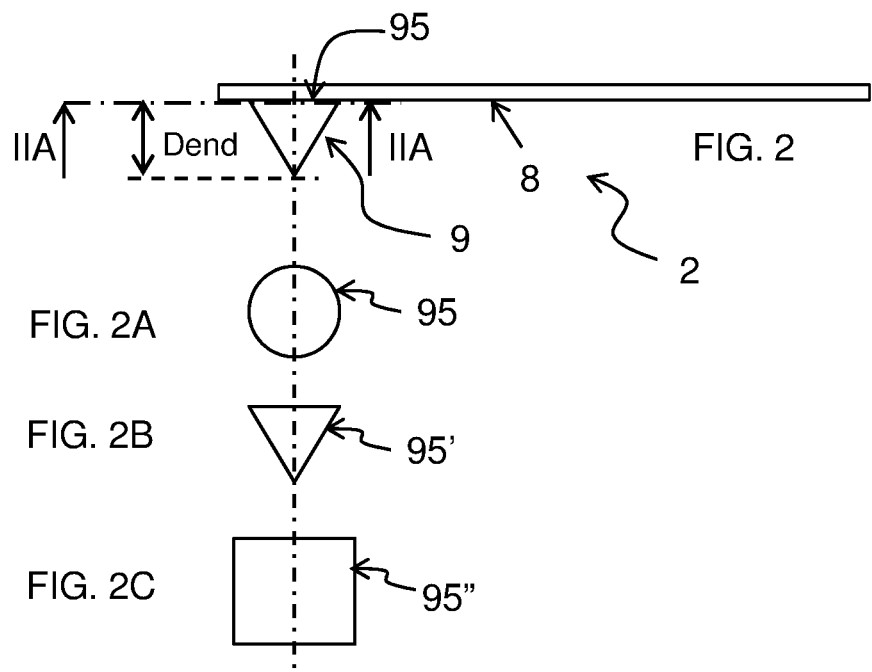
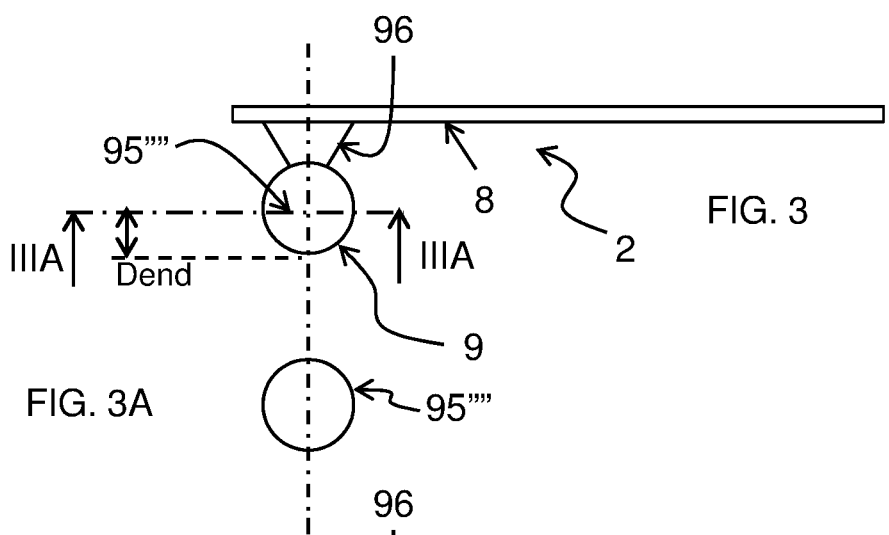
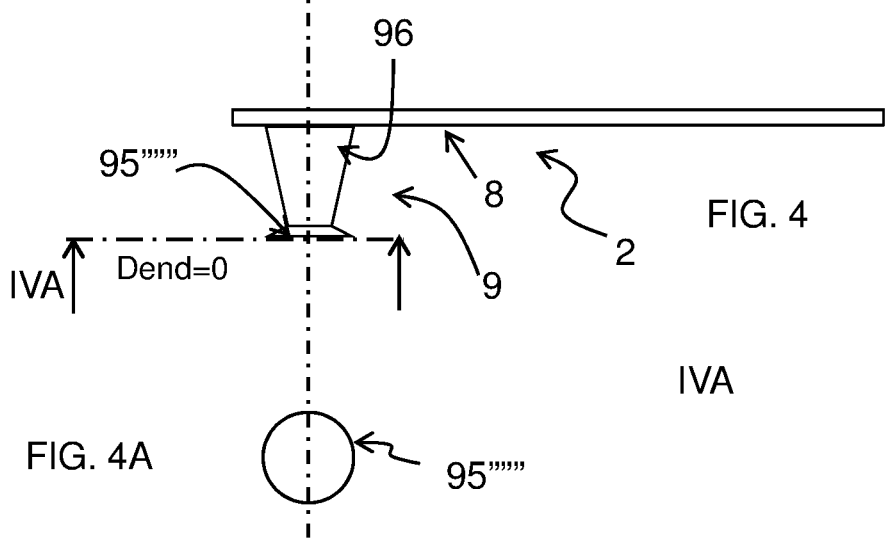

ND LITHOGRAPHIC SYSTEM

ATOMIC FORCE MICROSCOPY DEVICE, METHOD AND LITHOGRAPHIC SYSTEM

CROSS REFERENCE TO RELATED APPLICATIONS

This patent application is a U.S. National Phase of PCT International Application No. PCT/NL2018/050023, filed Jan. 12, 2018, which claims priority to European Application No. 17151418.5, filed Jan. 13, 2017, which are both expressly incorporated by reference in their entireties, including any references contained therein.

BACKGROUND OF THE INVENTION

Field of the Invention

The present invention relates to an atomic microscopy device.

The present invention relates to a method using an atomic microscopy device.

The present invention further relates to a lithographic system.

Related Art

Use of AFM methods for nondestructive imaging of buried nanostructures is known as such. Examples of such methods are Ultrasonic Force Microscopy (UFM), Heterodyne force microscopy, Acoustic force microscopy and bimodal and trimodal force microscopy. Good results have been obtained for applications like imaging nanoparticles in cells, subsurface imaging of particles inside polymers, buried defects inside the interconnects and silicon nanowires inside polymer. All these examples are limited to rigid nanoparticles suspended and buried inside a soft matrix, e.g. polymers.

These known methods however are insufficient for application in devices where the features to be detected are deeply arranged below the surface, such as 3D semiconductor devices like 3D NAND devices. Such device may have a high number of layers, e.g. from 50 to 200 layers, and the stack of layers may have a thickness of a few micron.

SUMMARY OF THE INVENTION

It is a first object of the present invention to provide an atomic microscopy device suitable for detection of subsurface features in 3D semiconductor devices.

It is second object of the present invention to provide a method, using an atomic microscopy device, suitable for detection of subsurface features in 3D semiconductor devices.

It is a third object of the invention to provide a lithographic system including an atomic microscopy device suitable for detection of subsurface features in 3D semiconductor devices.

According to the first object an atomic microscopy device according to a first aspect of the invention is provided in claim 1.

According to the second object a method according to a second aspect of the invention is provided in claim 8.

According to the third object a lithographic system according to a third aspect of the invention is provided in claim 26.

In an atomic force microscopy system at least one scan head is provided that includes a probe with a flexible carrier and a probe tip arranged on the flexible carrier. The flexible carrier may for example be a cantilever, but may also provided in another form, such as a membrane. During a measurement the probe tip and the sample are moved relative to each other in one or more directions parallel to the surface for scanning of the surface with the probe tip. An output signal is obtained by monitoring during scanning a motion of the probe tip relative to the scan head with a tip position detector during said scanning. The probe tip has an end portion with an end facing away from the flexible carrier. The tip may have its largest cross-section at the interface with the flexible cantilever. Alternatively, the tip may comprise an extension portion in addition to said at least an end portion, wherein the tip is mounted with its extension portion onto the flexible carrier. In again another embodiment the tip may widen towards it end facing the sample.

The probe tip may be shaped for example like a 3 or 4 sided pyramid. However, various other options are possible such a probe tip with the shape of a semi-sphere, or a fully spherical probe tip.

In the atomic force microscopy system according to the first aspect of the invention and the method according to the second aspect of the invention wherein the end portion of the tip has a cross-section with a cross-sectional area $A_{cx}$, a square root of which is at least 100 nm and wherein a distance $D_{end}$ between said end and said cross-section is at most two times the value of said square root.

Therewith it is possible to detect sub-surface features at larger depths than available with known systems and methods. In a more preferred embodiment the square root of said largest cross-section $A_{max}$ is at least 200 nm. In an even more preferred embodiment the square root of said largest cross-section $A_{max}$ is at least 500 nm.

Optionally detection may be further improved by using markers arranged in the sample. A preferred method is included wherein an optimal size of the markers is determined depending on the sample to be investigated. Also filtering methods are described for improving a resolution with which the markers can be detected.

BRIEF DESCRIPTION OF THE DRAWINGS

These and other aspects are described in more detail with reference to the drawing. Therein:

FIG. 2 shows a part of the atomic microscopy device of FIG. 1 in more detail, FIG. 2A shows a cross-section of a sub-part of that part according to the cross-section in a plane IIA-IIA as indicated in FIG. 2, FIG. 2B shows an alternative for said sub-part according to the same cross-section, FIG. 2C shows a further alternative for said sub-part according to the same cross-section, FIG. 3 shows an alternative part of the atomic microscopy device of FIG. 1 in more detail, FIG. 3A shows a cross-section of a sub-part of that part according to the cross-section in a plane IIIA-IIIA as indicated in FIG. 3, FIG. 4 shows another alternative part of the atomic microscopy device of FIG. 1 in more detail, FIG. 4A shows a cross-section of a sub-part of that part according to the cross-section in a plane IVA-IVA as indicated in FIG. 4, FIG. 5 schematically shows a part of the atomic microscopy device of FIG. 1 in an operational state, FIG. 6 schematically shows a part of another embodiment of an atomic microscopy device according to the first aspect in an operational state, FIG. 7 schematically shows an operational state of an embodiment of an atomic microscopy device according to the first aspect as well as various signals occurring in said operational state, FIG. 8 schematically shows a procedure for selecting an optimal size of features to be used in a particular application, FIG. 9 schematically shows a lithographic system according to a third aspect of the invention.

DETAILED DESCRIPTION OF EMBODIMENTS

Like reference symbols in the various drawings indicate like elements unless otherwise indicated.

Figure 1:
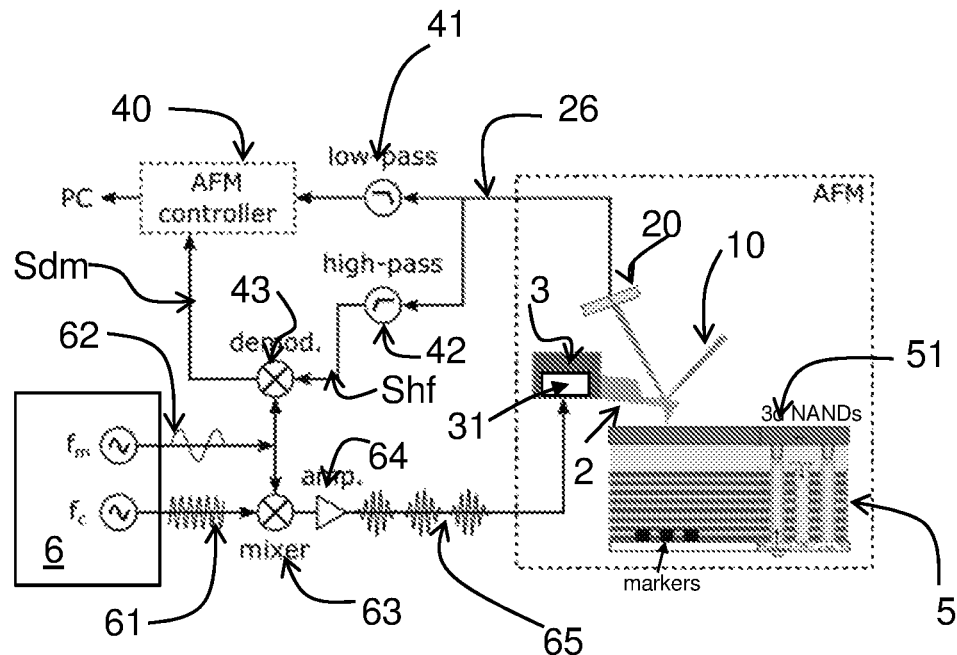
FIG. 1 schematically shows an atomic microscopy device according to a first aspect of the invention.

FIG. 1 schematically shows an atomic force microscopy device, the device comprising a scan head 3 with a probe 2. The probe 2, embodiments of which are shown in FIG. 2,2A,2B,2C and FIG. 3, 3A comprises a flexible carrier such as a cantilever 8 (or a membrane) and a probe tip 9 arranged on the flexible carrier. The scan head 3 enables scanning of the probe 2 relative to the surface 51 of a sample 5. During scanning, the probe tip 9 is brought in contact with the surface 51 of the sample 5. For example the probe tip 9 may be scanned across the surface of the sample 5 in contact mode (continuous contact between the probe tip 9 and the surface of the sample 5) or tapping mode (periodic contact between the probe tip 9 and the surface of the sample 5 during each cycle of a vibration applied to the cantilever 8). A laser unit (not shown) provides a laser beam 10 that impinges on the cantilever 8 and reflects towards an optical detector 20. Using the optical detector 20, vibrations in the cantilever 8 can be sensed due to small deflections of the reflected beam 10 under influence of such vibrations. This provides an output signal 26 for further analysis. An actuator (not shown) is provided that cooperates with at least one of the scan head 3 or a sample holder (not shown) for moving the probe tip 9 and the sample 5 relative to each other in one or more directions parallel to the surface 51 of the sample for scanning of the surface with the probe tip.

In the embodiment shown the laser unit and the optical detector 20 form a tip position detector for measuring motion of the probe tip relative to the scan head during said scanning, wherein the detector 20 provides the output signal 26 indicative for the motion. However, any suitable type of position detector may be applied, such as a piezo-resistive layer, the electrical resistance of which varies with probe deflection. Probe deflection may in that case be detected by detecting voltage differences in an electric signal applied to the piezo-resistive layer. As another alternative, probe deflection may be detected using a piezo-electric element or layer, the potential of which changes dependent on cantilever motion. Alternatively, capacitive measurements may be applied in an electrostatic sensing technique. As some further alternatives, one may also apply an interferometer to measure probe deflection or perform a heat flux measurement in a thermal method by using a temperature difference between probe and sample.

Figure 5:
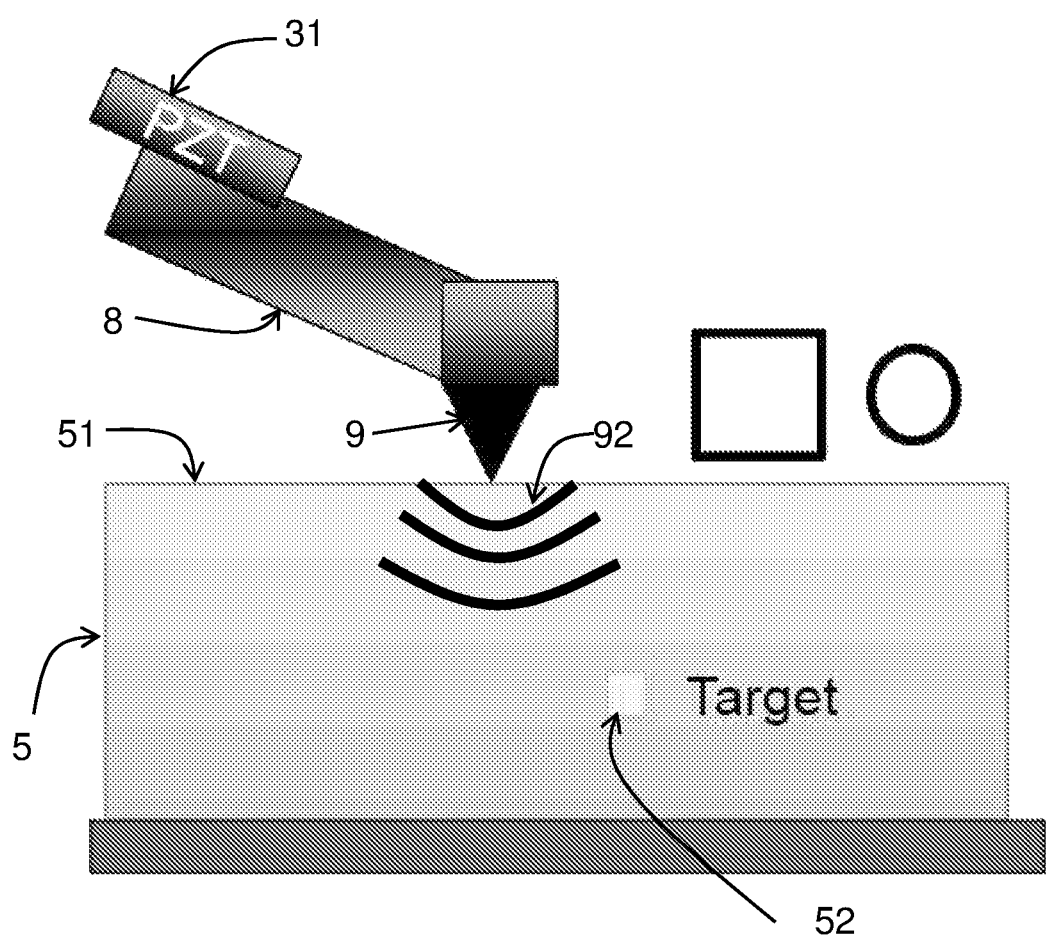
Figure 6:
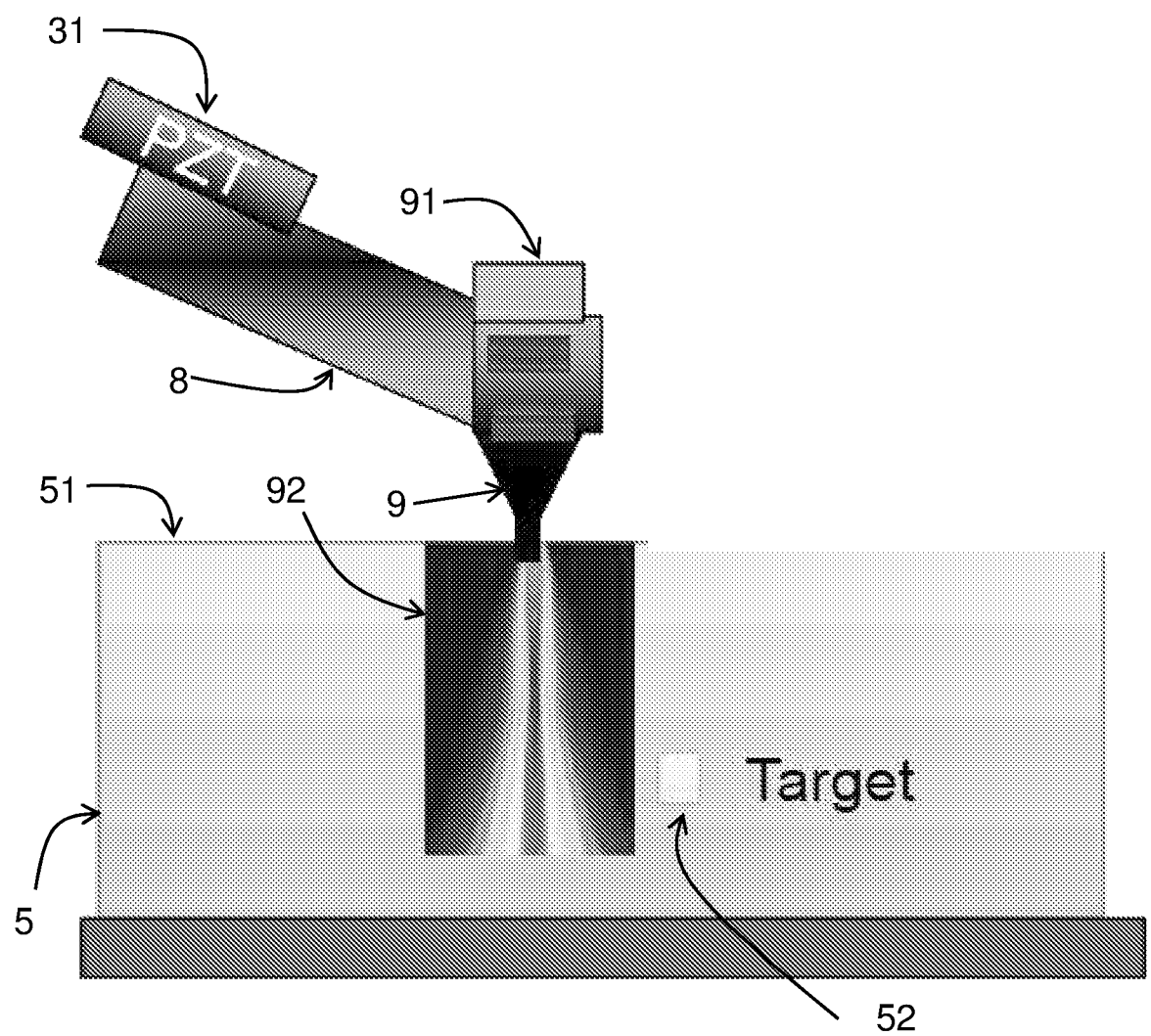

The atomic force microscopy device comprises a first actuator 31 for applying a first acoustic input signal 92 comprising a signal component at a first frequency to at least one of the probe or the sample. In the embodiment shown in FIG. 5 the first acoustic input signal 92 is induced by an actuator 31, here a piezo electric actuator attached to the cantilever 8. In the embodiment shown in FIG. 6, the first actuator is a high frequency actuator 91, e.g. a piezo-electric actuator or an electrostatic actuator is mechanically coupled to the tip 9.

An analysis system/controller 40 is provided for receiving and analyzing the output signal 26 from the tip position detector 20. In accordance with an aspect of the present invention, a generator 6 provides a first input signal 61 and in addition thereto a second input signal 62. The first input signal 61 is periodic with a frequency fc, and the second input signal 62 is a periodic signal with a frequency fm. A mixer 63 modulates the first input signal 61 with the second input signal 62. Amplifier 64 amplifies the modulated signal so obtained and provides an amplified modulated signal 65 to the first actuator 31.

Examples of a tip 9 are shown in more detail in FIG. 2, 2A, 2B, 2C and FIGS. 3 and 3A. Therein FIG. 2 shows a side-view of a tip 9 in one embodiment of the device and FIG. 2A shows a cross-section according to IIA-IIA in FIG. 2. FIGS. 2B and 2C respectively show of a tip 9 in other embodiments of the device according to the same cross-section.

In the embodiment of FIGS. 2 and 2A, the tip is formed as a cone. The cone-shaped tip 9 has its largest cross-sectional area Amax at its base 95, where it is attached to the cantilever 8. The tip 9 tapers over a distance Dend towards its end. In an example the square root $R_A$ of the largest cross-section Amax is equal to 150 nm and the distance Dend is equal to 100 nm.

In the embodiment of FIG. 2B, the tip is formed as a three-sided pyramid. The pyramid-shaped tip 9 has its largest cross-sectional area Amax at its base 95', where it is attached to the cantilever 8. The tip 9 tapers over a distance Dend towards its end. In an example the square root RA of the largest cross-section Amax is equal to 120 nm and the distance Dend is equal to 100 nm.

In the embodiment of FIG. 2C, the tip is formed as a four-sided pyramid. The pyramid-shaped tip 9 has its largest cross-sectional area Amax at its base 95", where it is attached to the cantilever 8. The tip 9 tapers over a distance Dend towards its end. In an example the square root RA of the largest cross-section Amax is equal to 200 nm and the distance Dend is equal to 150 nm.

FIG. 3 shows a side-view of a tip 9 in another embodiment of the device and FIG. 3A shows a cross-section according to IIIA-IIIA in FIG. 3. In the embodiment shown in FIG. 3, 3A the tip 9 has an extension portion 96 with which it is mounted onto the flexible carrier 8. The tip 9 includes a spherical body at the extension portion 96. From a central plane 95'''', which has the largest cross-sectional area Amax the end portion tapers over a distance Dend equal to the radius of the sphere. In this case the ratio RA/Dend is equal to the square root of pi ($\pi$). RA may for example be 500 nm.

FIG. 4 shows a side-view of a tip 9 in another embodiment of the device and FIG. 4A shows a cross-section according to IVA-IVA in FIG. 4. Also in this embodiment the tip 9 has an extension portion 96 with which it is mounted onto the flexible carrier 8. In this case the tip has an end portion in the form of a truncated cone with its widest side at its end face 95''''' that faces away from the flexible carrier 8. The cross-section according to IVA-IVA in FIG. 4 coinciding with the end face 95''''' of the tip 9 has a cross-sectional area with a square root of 700 nm. As the cross-section coincides with the end face, the distance Dend between the end of the tip and the cross-section having the specified cross-sectional area is equal to 0, which complies with the requirement that it should be at most two times the value of said square root.

The controller 40 is arranged for analyzing the output signal 26 for mapping at least subsurface nanostructures 52 below the surface 51 of the sample 5. (See FIG. 5, 6). Subsurface nanostructures 52 can be of various kinds, e.g. topological features formed by deliberately applied patterns in a layer or defects but may alternatively be non-topological features, such as density variations or stressed regions at a level below the surface 51 of the sample 5. The controller 40 may cooperate with additional modules as illustrated in FIG. 1. In the embodiment shown these include a low-pass filter 41, a high pass filter 42 and a demodulator 43. The low-pass filter 41 selects a low frequent portion of the output signal 26, e.g. below 1 kHz, as a feedback signal for positioning the probe 2 in a transversal direction with respect to the surface 51, for example to maintain a relatively constant static pressure of the tip 9 on the surface 51. The high-pass filter 42 selects a high frequent portion Shf of the output signal 26, and provides this to the demodulator 43. The demodulator 43 demodulates this high frequency signal Shf using the modulation signal 62 to provide the demodulated signal Sdm.

Figure 7:
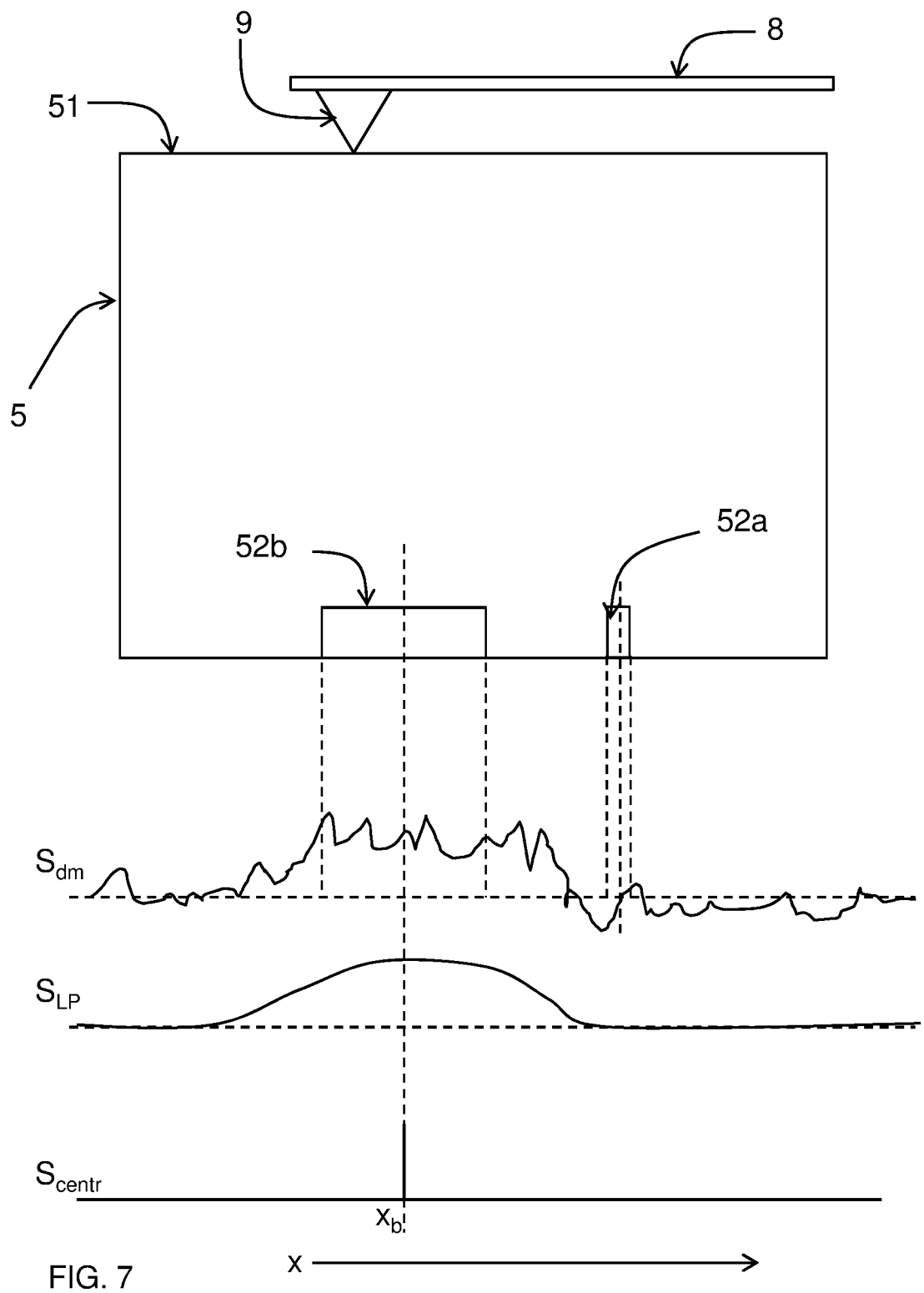

As illustrated in FIG. 7, the demodulated signal Sdm at the output of demodulator 43 is indicative for subsurface features present in the sample 5. This is illustrated in FIG. 7, which shows the amplitude of the demodulated signal Sdm as a function of the position x in a direction in a lateral direction with respect to the surface 51 of the sample 5. For features arranged deeply below the surface the signal to noise ratio of the signal is very low, which makes it impossible to locate such features. E.g. the signal to noise ratio in the signal resulting from a feature 52a is too much disturbed by measurement noise to be capable of identifying the feature. Larger features, e.g. feature 52b can still be detected in the signal Sdm, but due to their size, it is difficult to determine an accurate location indicative for their position. According to the present invention various approaches are offered for further processing to be applied to the demodulated signal Sdm in order to improve the spatial resolution.

Figure 1A:
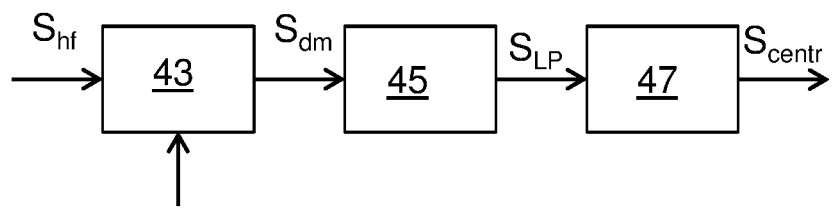
FIG. 1A shows exemplary signal processing elements of the device of FIG. 1.

According to one approach, the demodulated signal is low-pass filtered by a low-pass filter 45 (See FIG. 1A) to obtain a low-pass filtered feature signal $S_{LP}$. A centroid detector 47 then detects a centroid position in the low-pass filtered signal $S_{LP}$ and renders an output signal $S_{centr}$ indicative for a position $x_b$ of a detected sub-surface feature 52b determined on the basis of said centroid position in said low-pass filtered signal $S_{LP}$.

The low-pass filter 45 applied to the demodulated signal may for example be a box filter or another spatial filter such as a cosine or a Gaussian filter. The low-pass filter may have a spatial window in the same order of magnitude of the size $s_x$ of the features to be detected in the scanning direction x.

The spatial window may be defined as the square root of the second moment of the normalized point spread function of the spatial filter:

$$d_w = \sqrt{\int x^2 f(x) dx}$$

For example the spatial window $d_w$ may have a size in the range of $0.2 \, s_x$ to $5 \, s_x$. More preferably the spatial window $d_w$ may have a size in the range of $0.5 \, s_x$ to $2 \, s_x$.

The centroid detector 47 may for example select intervals $x_{begin}$-$x_{end}$ of the low pass filtered signal $S_{LP}$ wherein the value of the low pass filtered signal SLP exceeds a threshold value and determine a position $x_e$ such that:

$$x_e = \underset{xt}{\operatorname{argmin}} \sum_{x} S_{LP}(xt-x) - S_{LP}(xt+x)$$

In practice the size $s_x$ of the features that are detectable depends on various circumstances, such as the dimensions of the tip 9, the frequency range of the acoustic input signals and the depth of the features to be detected with respect to the sample surface 51.

Figure 1B:
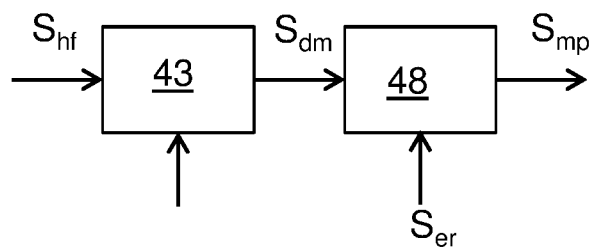
FIG. 1B shows alternative signal processing elements of the device of FIG. 1.

Another approach is schematically illustrated in FIG. 1B. Therein a marker position is estimated by curve fitting of an expected response curve to the demodulated signal $S_{dm}$. A curve fitting module 48 is provided to perform this curve fitting on the demodulated signal $S_{dm}$ based on an input signal Ser specifying the expected response curve and to provide an output signal Smp indicative for the position of the marker estimated therewith.

Figure 8:
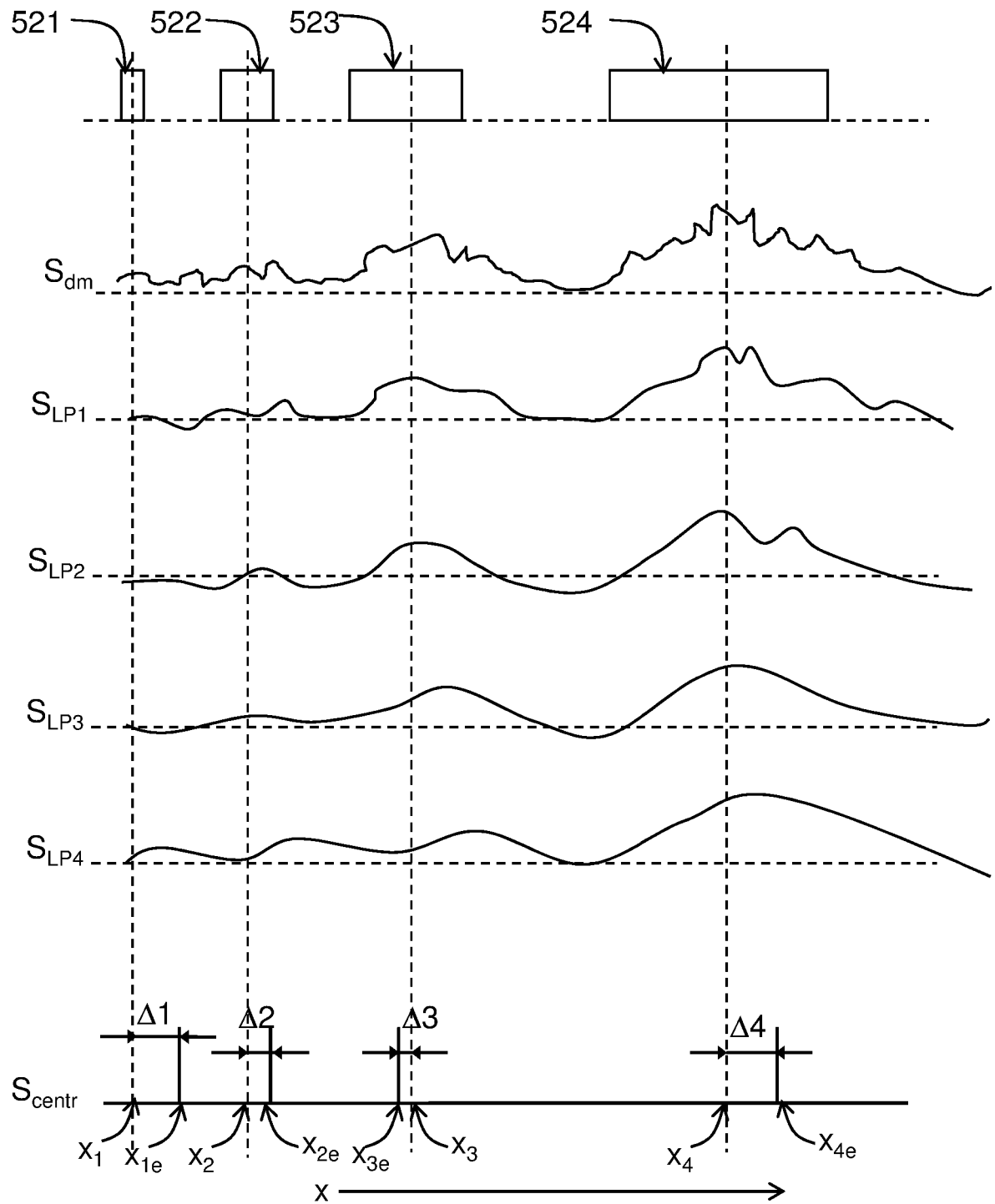

An optimal size $s_x$ to be selected for the features may be selected with the following procedure as illustrated in FIG. 8.

A test sample is provided at least substantially having the specifications corresponding to the device to be manufactured and provided with a set of subsurface features 521, 522, 523, 524 of mutually different size at a depth with respect to the surface where detection should take place.

The wording "at least substantially having the specifications" implies that the device at least substantially has the same number of layers e.g. +/-10% of the number of layers of the device to be manufactured and that the layers are manufactured of similar materials. Preferably the test sample is similar to the device to be manufactured apart from the set of subsurface features. The set of subsurface features may for example have a sizes selected from the range of 10 nm to 1 micron. For example a set of square shaped subsurface features may be provided subsequently having the sizes: 10 nm, 20 nm, 50 nm, 100 nm. 200 nm, 500 nm, 1000 nm.

Subsequently the test sample is scanned with the method according to the second aspect of the invention, while subsequently processing the demodulated signal $S_{dm}$ using subsequently different spatial window sizes $d_w$ each time corresponding to a respective size of the set of subsurface features. It is noted that it is sufficient to perform a single scan to obtain a demodulated signal $S_{dm}$, and to subsequently process this demodulated signal Sdm using the subsequently different spatial window sizes $d_w$. By way of example FIG. 8 shows a first processed signal $S_{LP1}$, obtained with a low-pass filter with a window size $d_{w1}=s_{x1}$, a second processed signal $S_{LP2}$, obtained with a low-pass filter with a window size $d_{w2}=s_{x2}$, a third processed signal $S_{LP3}$, obtained with a low-pass filter with a window size $d_{w3}=s_{x3}$, and a fourth processed signal $S_{LP4}$, obtained with a low-pass filter with a window size $d_{w4}=s_{x4}$.

Subsequently the position of each of the subsurface features 521, 522, 523 and 524 is estimated using the signal $S_{LP1}$, $S_{LP2}$, $S_{LP3}$, $S_{LP4}$, obtained with the low-pass filter having the corresponding window size $d_{w1}$, $d_{w2}$, $d_{w3}$, $d_{w4}$, Then a deviation $\Delta_1$, $\Delta_2$, $\Delta_3$, $\Delta_4$ between the estimated position $x_{1e}$, $x_{2e}$, $x_{3e}$, $x_{4e}$ and the actual position $x_1$, $x_2$, $x_3$, $x_4$ of each of the subsurface features 521, 522, 523 and 524 is determined and the size the subsurface feature having the smallest absolute value for the deviation is selected as the size of the markers to be used in the manufacturing stage.

It is noted that the method of FIG. 8 can analogically be used in combination with the detection method as described with reference to FIG. 1B. In that case the expected response curve as indicated by the signal Ser is adapted to the specifications of the subsurface features 521, 522, 523 and 524.

Figure 9:
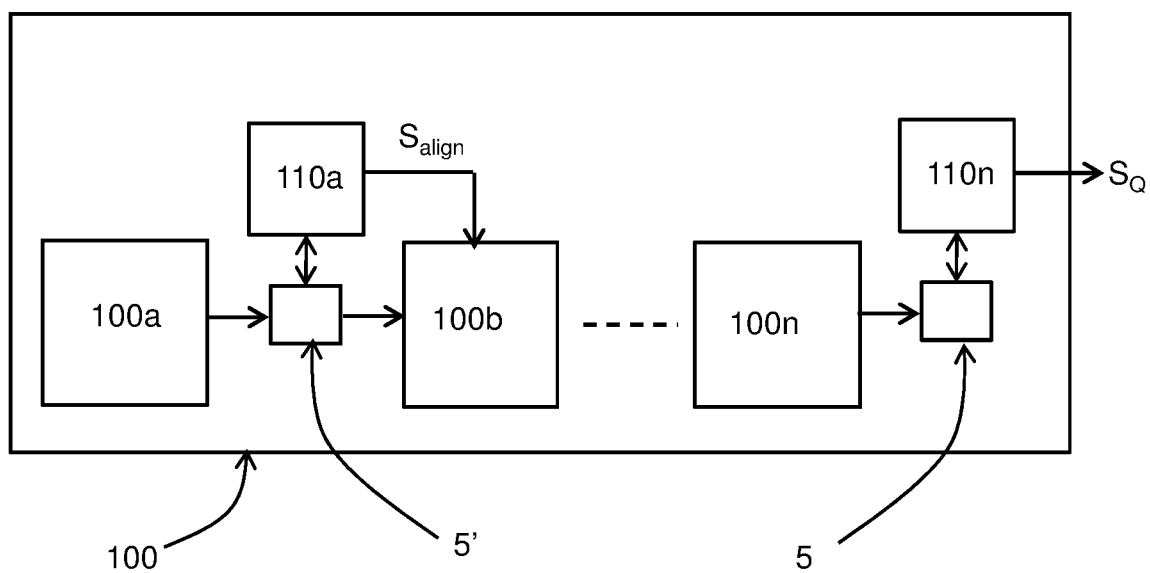

FIG. 9 schematically shows a lithographic system 100 for manufacturing of a multilayer semiconductor device 5. The lithographic system 100 comprises an atomic force microscopy device 110a according to the second aspect of the invention. The lithographic system is arranged to manufacture the semiconductor device in mutually subsequent manufacturing stages 100a, 100b, . . . 100n. The mutually subsequent manufacturing stages 100a, 100b, . . . 100n at least comprise a first manufacturing stage 100a and a second manufacturing stage 100b. The atomic force microscopy device 110a is arranged to inspect a semi-finished product 5' obtained in the first manufacturing stage 100a and to provide an analysis signal $S_{align}$ indicative for a position of sub-surface features in the semi-finished product 5'. The lithographic system 100 is arranged to use the analysis signal $S_{align}$ for alignment of the semi-finished product 5' in the second manufacturing stage 100b. In the embodiment of FIG. 9, the lithographic system 100 comprises a further atomic force microscopy device 110n that analyses a quality of the multilayer semiconductor device 5 and provides an output signal $S_Q$ indicative for said quality. The output signal $S_Q$ may be provided as a binary signal that indicates whether or not the quality of the semiconductor device meets predetermined requirements. Alternatively, or in addition the output signal SQ may provide diagnostic information enabling an operator of the lithographic system to improve its operation.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. For example, any number of additional acoustic input signals may be applied, either to the sample or to the probe tip, without departing from the claimed invention. Also, the present invention may be combined with additional measurement techniques to obtain additional information from the combination of these. Also kinematic inversions are considered inherently disclosed and to be within the scope of the invention. In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. An atomic force microscopy device arranged for determining sub-surface structures in a sample, the device comprising:
   a scan head including a probe, wherein the probe comprises a flexible carrier and a probe tip arranged on the flexible carrier;
   an actuator that cooperatively operates with at least one of the scan head or a substrate holder for moving the probe tip and the sample relative to each other in one or more directions parallel to a surface of the sample for a scanning of the surface with the probe tip;
   a tip position detector that measures a motion of the probe tip relative to the scan head during the scanning, wherein the detector is arranged for providing an output signal indicative of the motion; and
   a controller for receiving and analyzing the output signal from the tip position detector;
   a first actuator that applies a first acoustic input signal comprising a signal component at a first frequency to at least one of the group consisting of: the probe, and the sample;
   wherein the controller is arranged for analyzing the output signal for generating a mapping of one or more sub-surface nanostructures below the surface of the sample,
   wherein the probe tip has an end portion with an end that faces away from said flexible carrier,
   wherein said end portion has a cross-section with a cross-sectional area Acx,
   wherein a square root of the cross-sectional area (Acx) is at least 100 nm, and wherein a distance (Dend) between said end and said cross-section is at most two times the value of said square root, and
   wherein said controller comprises:
      a first processing module for reconstructing a feature signal (Sdm) from said output signal (Sscan),
      a second processing module for low-pass filtering said feature signal and for providing a low-pass filtered signal ($S_{LP}$), and
      a centroid identification module for indicating (Scentr) a center position of a detected sub-surface feature.

2. The atomic force microscopy device according to claim 1, wherein the square root of a largest cross-section Amax of the probe tip is at least 200 nm.

3. The atomic force microscopy device according to claim 1, wherein the first actuator is arranged for applying the first acoustic input signal to the probe,
   wherein the first actuator comprises at least one element of the group consisting of:
      an acoustic transducer connected to at least one of the group consisting of: the flexible carrier and the probe tip,
      an electrostatic actuator cooperating with the flexible carrier,
      an electrostatic actuator cooperating with the probe tip wherein the probe tip is flexibly attached to the flexible carrier,
      a piezo electric actuator cooperating with the flexible carrier,
      a piezo electric actuator cooperating with the probe tip wherein the probe tip is flexibly attached to the flexible carrier, and a pulsed optical source for photothermic excitation of at least one of the flexible carrier or the probe tip.

4. The atomic force microscopy device according to claim 1, further comprising a pulsed optical source for applying said first acoustic input signal or a further acoustic input signal using a photothermic excitation of the surface of the sample.

5. An atomic force microscopy device arranged for determining sub-surface structures in a sample, the device comprising:
- a scan head including a probe, wherein the probe comprises a flexible carrier and a probe tip arranged on the flexible carrier;
- an actuator that cooperatively operates with at least one of the scan head or a substrate holder for moving the probe tip and the sample relative to each other in one or more directions parallel to a surface of the sample for a scanning of the surface with the probe tip;
- a tip position detector that measures a motion of the probe tip relative to the scan head during the scanning, wherein the detector is arranged for providing an output signal indicative of the motion; and
- a controller for receiving and analyzing the output signal from the tip position detector;
- a first actuator that applies a first acoustic input signal comprising a signal component at a first frequency to at least one of the group consisting of: the probe, and the sample;
- wherein the controller is arranged for analyzing the output signal for generating a mapping of one or more sub-surface nanostructures below the surface of the sample,
- wherein the probe tip has an end portion with an end that faces away from said flexible carrier,
- wherein said end portion has a cross-section with a cross-sectional area Acx,
- wherein a square root of the cross-sectional area (Acx) is at least 100 nm, and
- wherein a distance (Dend) between said end and said cross-section is at most two times the value of said square root, and
- wherein said controller comprises:
  - a first processing module for reconstructing a feature signal (Sdm) from said output signal (Sscan),
  - a second processing module for low-pass filtering said feature signal and for providing a low-pass filtered signal ($S_{LP}$), and
  - a curve fitting module to perform curve fitting on the demodulated signal (Sdm) based on an input signal (Ser) specifying an expected response curve for a marker and to provide an output signal (Smp) indicative for a position of the marker estimated therewith.

6. A method of determining sub-surface structures in a sample using an atomic force microscopy system that comprises a scan head including a probe,
- wherein the probe comprises a flexible carrier and a probe tip arranged on the flexible carrier,
- wherein the method comprises:
  - moving the probe tip and the sample relative to each other in one or more directions parallel to a surface of the sample for a scanning of the surface with the probe tip;
  - monitoring a motion of the probe tip relative to the scan head with a tip position detector during said scanning for obtaining an output signal;
  - applying, during said scanning, a first acoustic input signal comprising a signal component at a first frequency to at least one of the group consisting of: the probe, and the sample;
  - analyzing the output signal for generating a mapping of a one or more subsurface nanostructures below the surface of the sample,
- wherein the probe tip has an end portion with an end that faces away from said flexible carrier,
- wherein said end portion has a cross-section with a cross-sectional area Acx,
- wherein a square root of the cross-sectional area Acx is at least 100 nm, and
- wherein a distance Dend between said end and said cross-section is at most two times the value of said square root,
- wherein the at least a first acoustic input signal comprises various signal components,
- wherein the various signal components comprise a carrier frequency (fc),
- wherein the carrier frequency (fc) is lowered by a modulation frequency (fm) to obtain a frequency component (fc−fm), and
- wherein the carrier frequency fc is increased by the modulation frequency fm to obtain a frequency component (fc+fm).

7. The method according to claim 6, wherein the sample is a device comprising a substrate having an at least a first device layer.

8. The method according to claim 7, wherein the device comprises at least one marker arranged in a plane between the substrate and the at least a first device layer.

9. The method according to claim 8, wherein the device is a semi-finished multilayer semiconductor device comprising a resist layer covering one or more layers including the at least a first device layer, wherein the method further comprises:
- determining, as a part of analyzing said output signal, an alignment of sub-surface structures defined by the at least one marker and/or by a pattern in said at least a first device layer, and
- adapting, based on the determined alignment of said sub-surface structures, the alignment of the semiconductor device relative to an alignment of a further patterned device layer to be formed on the semi-finished multilayer semiconductor device.

10. The method according to claim 9, wherein the device is a semiconductor device that comprises a stack of device layers including at least a second patterned device layer in addition to said at least a first patterned device layer, and
- wherein the method further comprises determining an overlay error between the at least a first patterned layer and the at least a second patterned layer based on the analysis.

11. The method according to claim 6, wherein the at least a first acoustic input signal is applied in absence of a further acoustic input signal, and wherein the first frequency is within a range of 0.01 megahertz to 100 megahertz.

12. A method of determining sub-surface structures in a sample using an atomic force microscopy system that comprises a scan head including a probe, wherein the probe comprises a flexible carrier and a probe tip arranged on the flexible carrier, wherein the method comprises:
- moving the probe tip and the sample relative to each other in one or more directions parallel to a surface of the sample for a scanning of the surface with the probe tip;
- monitoring a motion of the probe tip relative to the scan head with a tip position detector during said scanning for obtaining an output signal;

applying, during said scanning, a first acoustic input signal comprising a signal component at a first frequency to at least one of the group consisting of: the probe, and the sample;

analyzing the output signal for generating a mapping of a one or more subsurface nanostructures below the surface of the sample, wherein the probe tip has an end portion with an end that faces away from said flexible carrier, wherein said end portion has a cross-section with a cross-sectional area Acx, wherein a square root of the cross-sectional area Acx is at least 100 nm, wherein a distance Dend between said end and said cross-section is at most two times the value of said square root, wherein the first frequency of the at least a first acoustic input signal has a value of at least 1 GHz, wherein said at least a first acoustic input signal is applied to the probe, wherein the at least a first acoustic signal comprises, in addition to said first component, a second component of a second frequency lower than said first frequency, wherein said first component is provided pulsewise, and wherein said analyzing comprises echo acoustic measurements.

13. The method according to claim 12 further comprising:

generating a demodulated signal (Sdm) from said output signal (Shf), low-pass filtering said demodulated signal to obtain a low-pass filtered signal ($S_{LP}$), detecting a centroid position in said low-pass filtered signal, and identifying a position of a detected sub-surface feature on the basis of said centroid position in said low-pass filtered feature signal.

14. A method according to claim 13, wherein for selecting a size of a marker and a window size for low-pass filtering said demodulated signal, the method further comprises:

providing a test sample with a set of subsurface features having mutually different sizes, using the method to determine the demodulated signal, low-pass filtering the demodulated signal with a set of low-pass filters with respective window sizes corresponding to the sizes of said subsurface features in said test sample, detecting a centroid position of each of the set of subsurface features in the low-pass filtered signal obtained with the low-pass filter with the corresponding window size, and estimating a position of the detected sub-surface feature on the basis of the centroid position of each of the subsurface features in its corresponding low-pass filtered feature signal.

15. A method according to claim 12, further comprising:

generating a demodulated signal (Sdm) from said output signal (Shf), low-pass filtering said demodulated signal to obtain a low-pass filtered signal (SLP), estimating a marker position by curve fitting of an expected response curve to the demodulated signal $S_{dm}$, and providing an output signal Smp indicative for the position of the marker estimated therewith.

16. The method according to claim 6 further comprising:

generating a demodulated signal (Sdm) from said output signal (Shf), low-pass filtering said demodulated signal to obtain a low-pass filtered signal ($S_{LP}$), detecting a centroid position in said low-pass filtered signal, and identifying a position of a detected sub-surface feature on the basis of said centroid position in said low-pass filtered feature signal.

17. The method according to claim 16, wherein for selecting a size of a marker and a window size for low-pass filtering said demodulated signal, the method further comprises:

providing a test sample with a set of subsurface features having mutually different sizes, using the method to determine the demodulated signal, low-pass filtering the demodulated signal with a set of low-pass filters with respective window sizes corresponding to the sizes of said subsurface features in said test sample, detecting a centroid position of each of the set of subsurface features in the low-pass filtered signal obtained with the low-pass filter with the corresponding window size, and estimating a position of the detected sub-surface feature on the basis of the centroid position of each of the subsurface features in its corresponding low-pass filtered feature signal.

18. A method according to claim 6, further comprising:

generating a demodulated signal (Sdm) from said output signal (Shf), low-pass filtering said demodulated signal to obtain a low-pass filtered signal (SLP), estimating a marker position by curve fitting of an expected response curve to the demodulated signal $S_{dm}$, and providing an output signal Smp indicative for the position of the marker estimated therewith.

* * * * *